INVENTOR.
CURTIS E. WARD
BY Harry E. Aine
ATTORNEY

INVENTOR.
CURTIS E. WARD
BY [signature]
ATTORNEY

United States Patent Office 3,310,746

Patented Mar. 21, 1967

3,310,746

MICROWAVE OSCILLATOR OUTPUT CIRCUIT HAVING A BAND REJECT FILTER FOR INCREASING ELECTRONIC TUNABLE BANDWIDTH

Curtis E. Ward, Los Altos, Calif., assignor to Varian Associates, Palo Alto, Calif., a corporation of California Filed Feb. 4, 1963, Ser. No. 256,081
21 Claims. (Cl. 325—439)

Figure 1:
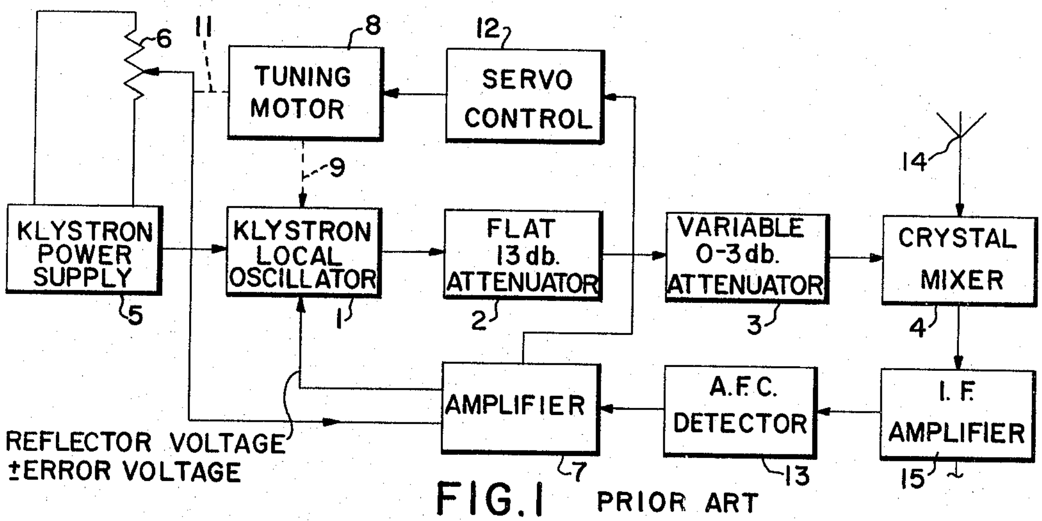

The present invention relates in general to microwave oscillator circuits and more particularly to such circuits having increased electronic tunable bandwith between half power points. Such improved oscillator circuits are especially useful for local oscillator service in multichannel microwave radar receivers.

Heretofore, multichannel radar receivers have typically used reflex klystrons as the local oscillator source. Reflex klystrons without mechanical tuners have an electronically tunable bandwidth, between half power points, for the power output mode of about 1%. Thus, a 10 gc. radar, utilizing an electronically tunable reflex klystron, having 0.5% channel separation could accommodate only two channels. Several missile weapon systems require at least five channel operation and therefore, complicated bulky and expensive combined electronic and mechanical systems were heretofore employed for such reflex klystrons to obtain the required 2.5% tunable bandwidth between half power points. A typical prior art system involves the use of mechanical tuning devices in the klystron oscillator as well as an associated drive motor, a pair of gear trains, a servo control and a ganged reflector voltage supply potentiometer.

In the present invention, the electronically tunable bandwidth between three db points of the klystron oscillator has been increased to at least 2.5% thereby eliminating the prior required automatic mechanical tuning apparatus including the klystron mechanical tuner, drive motor, associated gear trains and servo control unit. The present invention more than halves the prior size, weight and expense of the local oscillator circuit and at the same time improves its reliability.

Briefly, the aforementioned improvement is obtained by the provision of a band reject filter tuned to approximately the same frequency as the center of the klystron power output mode for leveling the power output mode as passed by the filter to the mixer whereby the electronic tunable bandwidth between half power points of the "leveled" mode has been increased from 1% to, for example, 2.5% or more.

The principal object of the present invention is the provision of an improved microwave oscillator circuit having increased electronic tunable bandwidth between half power points making such oscillator especially useful for local oscillator service.

One feature of the present invention is the provision of a band reject filter connected to the output of the microwave oscillator and having its reject band tuned to a frequency within the electronically tunable power mode of the oscillator for leveling the power mode and thereby increasing the electronic tunable bandwidth.

Another feature of the present invention is the same as the preceding feature plus the provision of an attenuator disposed in circuit between the oscillator and the band reject filter for rendering the oscillator less responsive to deleterious reactive effects of said band reject filter.

Another feature of the present invention is the same as the next preceding feature wherein the attenuator is formed of rectangular waveguide having a resistive card centrally disposed therein and wherein the band reject filter includes a resonant post extending into the guide providing a resonant shunt across the guide, the resonant shunt being tuned to approximately the center frequency of the oscillator power mode.

Another feature of the present invention is the same as the next preceding feature wherein the resonant shunt includes a second post extending into the guide and electromagnetically coupled to the first post for ease in adjusting the Q and frequency of the resonant shunt.

Figure 3:
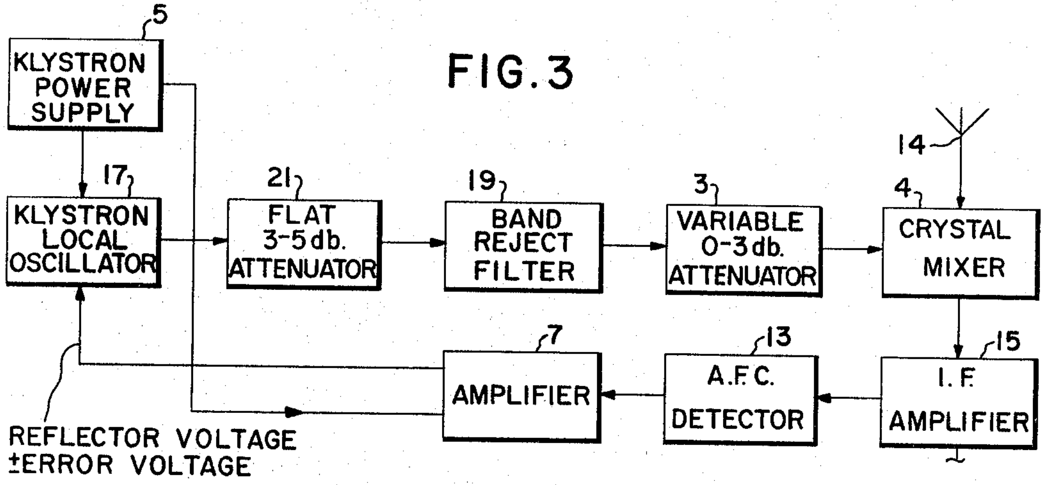
Figure 2:
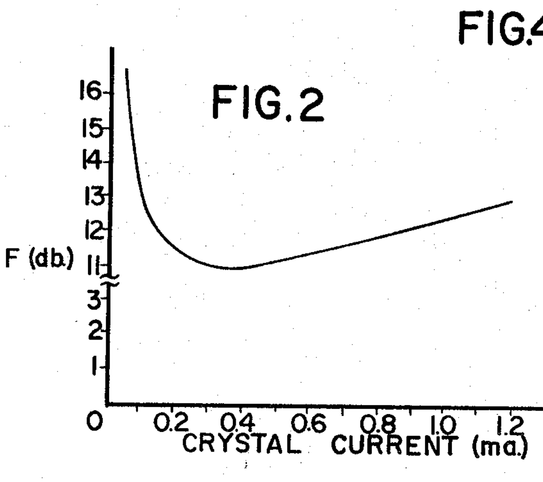
Figure 4:
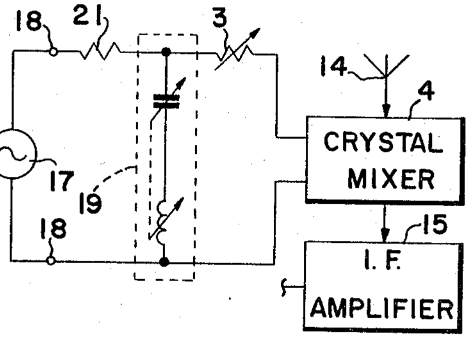
Figure 6:
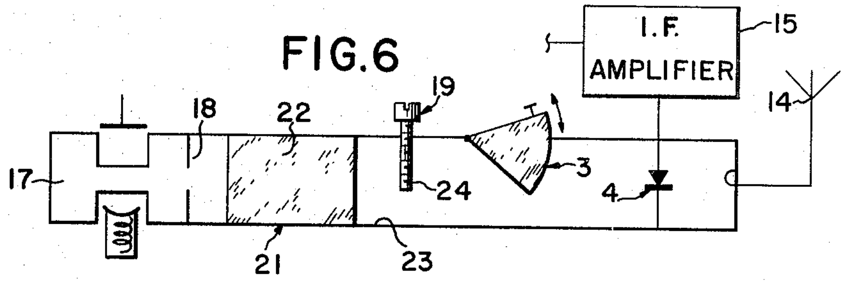
Figure 7:
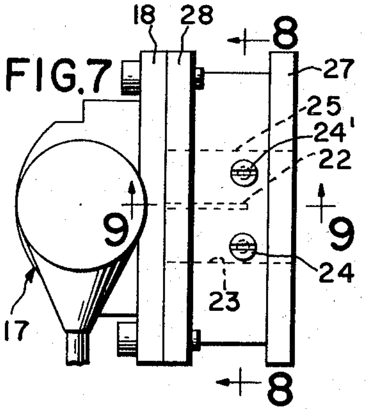
Figure 8:
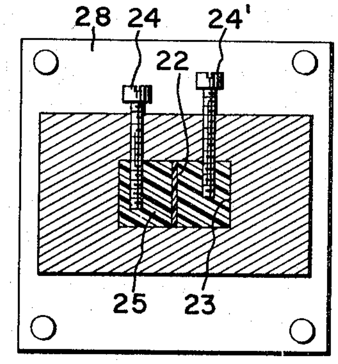
Figure 5:
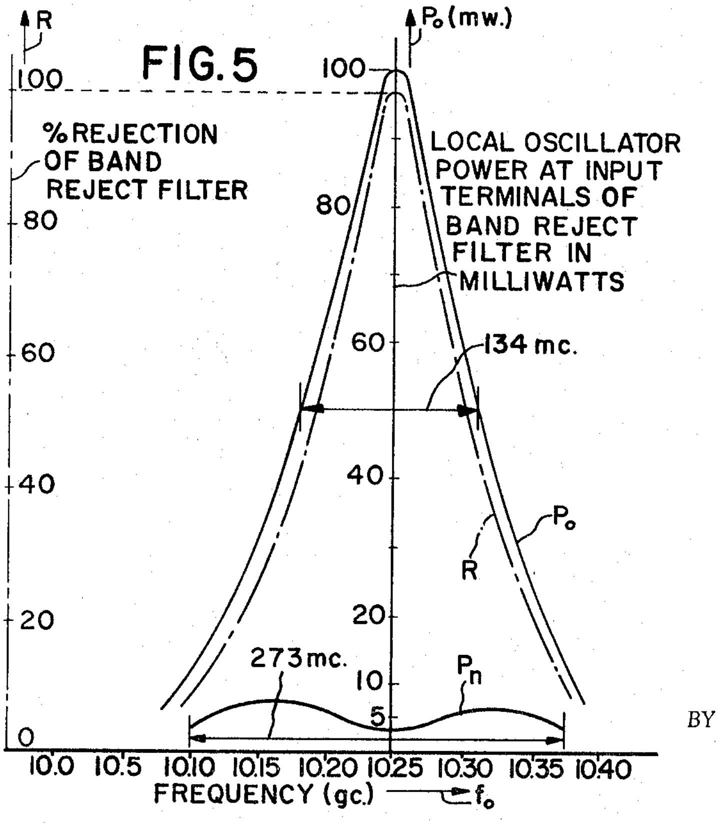
Figure 9:
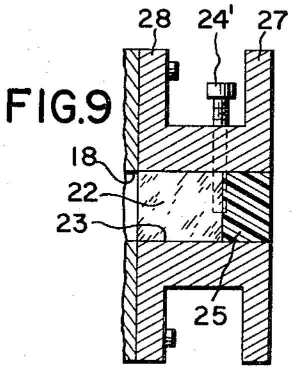

Other features and advantages of the present invention will become apparent upon a perusal of the specification taken in connection with the accompanying drawings wherein:

FIG. 1 is a schematic block diagram showing a typical local oscillator circuit of the prior art, FIG. 2 is a graph of noise figure in db versus crystal current for a typical crystal detector microwave receiver, FIG. 3 is a schematic block diagram of a local oscillator circuit employing novel features of the present invention, FIG. 4 is a schematic circuit diagram partly in block diagram form showing certain features of the present invention, FIG. 5 is a graph showing the power mode of the local oscillator before and after passage through the band reject filter and also showing the rejection response of the band reject filter, all as a function of frequency, FIG. 6 is a schematic waveguide representation of the waveguide circuit of FIG. 3, FIG. 7 is a plan view of the attenuator and band reject filter features of the present invention, FIG. 8 is a cross-sectional view of the structure of FIG. 7 taken along line 8—8 in the direction of the arrows, and FIG. 9 is a longitudinal cross-sectional view of the structure of FIG. 7 taken along line 9—9 in the direction of the arrows.

Referring now to FIG. 1, there is shown the typical microwave local oscillator mixer circuit of the prior art. More particularly, a tunable external cavity X-band reflex klystron oscillator 1 as, for example, a V–217 C made by Varian Associates feeds its output of approximately 30 milliwatts to a "flat" (frequency insensitive) 12 db attenuator 2 for reducing the peak of the power mode to 1.5 milliwatts. The output of the 13 db attenuator is fed via an adjustable 0–3 db attenuator 3 to the local oscillator input port of a crystal diode mixer 4. The adjustable attenuator 3 is provided to adjust the local oscillator power level, at the crystal, to preferably 0.5 milliwatt at the half power point of the local oscillator electronically tunable power mode.

"Electronically tunable," as used herein, means a tuning mechanism which functions predominantly due to a purely electrical effect as opposed to an electromechanical effect. Examples of electronic tuning include tuning a klystron by reflector voltage, tuning a resonator by a voltage variable capacitor, or tuning a resonator by a current responsive inductor.

It is advantageous to maintain a low local oscillator power level of 0.5 to 1.0 milliwatt at the crystal diode 4 because the noise figure of the receiver increases rapidly with decreases in the power level below 0.5 milliwatt and not quite as rapidly with increase in power level above 0.5 milliwatt, see FIG. 2 showing a graph of noise figure, F, versus crystal current. A local oscillator power of 0.5 milliwatt corresponds, typically to 0.5 ma. of crystal current.

The adjustable attenuator 3 also provides compensation for losses that vary from one receiver to the next due to different losses encountered at the waveguide junctions in the waveguide plumbing between the klystron and he crystal diode 4.

The reflex klystron 1 is supplied with anode and cathode voltage as well as heater power directly from a klystron power supply 5. Reflector voltage for the reflex kylstron is derived from the power supply 5 via a potentiometer 6 and variable amplifier 7 which either adds to or subtracts from the potentiometer derived voltage in response to an error voltage, described below, in order to electronically control the frequency of the klystron 1.

The reflex klystron 1 includes a mechanical tuner, not shown, operable in an external cavity for tuning the klystron outside the limits of the 0.3% electronic tunable bandwidth of the power mode.

A tuning motor 8 drives the klystron's mechanical tuner via the intermediary of a suitable gear train indicated at 9. The tuning motor, also through a suitable gear train indicated at 11, drives the potentiometer 6 of the klystron power supply 5. The tuning motor 8 is actuated via an error control signal derived from the amplifier 7 and fed to the motor 8 via the intermediary of a suitable servo controller 12. The error signals for controlling the frequency of the klystron 1 as found in the output of the amplifier 7 are initially derived from an automatic frequency control (A.F.C.) detector 13. The A.F.C. detector 13 derives its error signal from the I.F. frequency which is obtained from the mixer 4 by mixing the local oscillator signal with the signal obtained from the antenna 14 to produce the intermediate frequency, I.F., which is amplified in I.F. amplifier 15 and fed to the input of the A.F.C. detector 13.

In operation of the combined electronic and mechanical klystron tuning combination of FIG.1 is capable of tuning the local oscillator circuit over a 3 db tunable bandwidth of 250 megacycles thereby accommodating the five 50 megacycle spaced channels of the radar. The combined electronic and mechanical tuning arrangement of FIG. 1 has served to expand the 0.3% electronic tuning bandwidth of the kylstron 1 to the effective tunable bandwidth of 2.5%

Referring now to FIG. 3 there is shown in schematic block diagram form the local oscillator circuit of the present invention. Like reference numerals have been utilized throughout the drawings to refer to like structure.

A reflex klystron local oscillator 17 is employed which need not be mechanically tunable. Such a reflex klystron 17 delivers 200 milliwatts X-band power at its output terminal 18 with an output power mode having an electronic tunable bandwidth, between half power points, of 134 mc. centered at 10.25 gc. The power mode response curve has a shape as shown in FIG. 5 and is designated by $P_0$. However, the $P_0$ curve of FIG. 5 shows only half the power of the power mode as seen at the output terminal 18 of the klystron 17 because $P_0$ represents the power seen at the entrance to a band reject filter after having passed through a 3 db attenuator, described below. The electronic tunable bandwidth between half power points for the power mode as seen at the output terminal 18 of the klystron 17 is 134 mc. or approximately half the required 250 mc. necessary for a 5 channel radar.

The klystron output power is fed to a band reject filter 19 via the intermediary of a "flat" or frequency insensitive attenuator 21 preferably providing between 3 and 5 db uniform attenuation over the entire electronic tunable bandwidth of the power mode. Higher attenuation may be used if warranted by a higher output power of the klystron 17. A typical flat attenuator 21 (see FIG. 6) is formed by a resistive card 22 centrally disposed of and directed across an X-band waveguide 23 from one broad wall to the other broad wall. A preferred attenuator structure 21 will be more fully described below with regard to FIGS. 7–9.

As an alternative, flat attenuator 21 is formed by a non-reciprocal attenuator or isolator such as an X-band resistive strip field displacement isolator connected to pass energy from the klystron 17 to the band reject filter 19 substantially without attenuation, as of 0.5 db, and to heavily attenuate, as of 20 db, wave energy reflected from the band reject filter 19 back to the klystron thereby isolating the klystron 17 without appreciably lowering the power level passed on toward the crystal diode 4. This scheme is particularly useful when it is desired to obtain the highest output power from a given klystron tube over the increased electronically tunable bandwidth.

The band reject filter 19 is preferably formed by a resonant post 24 inserted into a section of X-band waveguide 23 from one broad wall. The post 24 is preferably directed across the guide toward the opposing broad wall to form a resonant shunt across the guide. The post 24 is conveniently formed by a gold plated 2–56 machine screw screwed into the guide through a threaded hole. A preferred embodiment of the band reject filter 19 will be more fully described below with regard to FIGS. 7–9.

The operative function of the band reject filter 19 can best be seen by reference to FIGS. 4–6. FIG. 5 shows the oscillator power mode $P_0$ incident upon the band reject filter 19. The band reject filter is tuned and adjusted to have a reject response R with a shape closely conforming to the shape of the power mode $P_0$ and closely center in frequency at the center frequency of the power mode $P_0$. When the Q of the band reject response R is slightly less than the effective Q of the power mode, the power mode, as passed by band reject filter 19, will be substantially leveled.

For example, the specific X-band klystron power mode $P_0$ of FIG. 5, having an effective Q of about 135 when passed through a band reject filter 19 with a response Q of about 150, yielded a net power mode $P_n$ at the output of the filter 19 with an electronically tunable bandwidth between half power points of approximately 273 mc. or 2.7%. The net power mode over the 273 mc. band had been reduced to a power level of between 3.5 and 7 milliwatts. In this case the variable attenuator 3 is preferably set to between 7 and 10 db to reduce the mode power amplitude applied to the crystal to between 0.5 and 1.0 milliwatt. A typical variable attenuator 3 is formed by a quadrant shaped resistive card 25 rotatable into the guide 23 for varying the attenuation of wave energy passing through the guide. Variable attenuator 3 also serves the function of preventing detuning of the band reject filter by reactive impedances reflected from the crystal mixer 4.

Adjustment of the Q and frequency for a resonant post, shunt type, band reject filter is obtained by selecting the point of insertion into the guide and by adjusting the extent of penetration of the post 24 into the guide. As the location of the post nears the narrow side wall of the guide the Q of the post is increased. The greater the penetration of the post into the guide the lower its resonant frequency. It has been found that a single post will provide suitable band reject response when offset from the center line of the waveguide 23 and disposed in a transverse plane of the guide passing through or near the end of the resistive card 22 remote from the klystron 17. Adjustment of the Q and frequency of the band reject filter is facilitated by employment of two posts 24 electromagnetically coupled together. A preferred embodiment using two posts 24 is described in greater detail below with regard to FIGS. 7–9.

The function of the flat attenuator 21 is to isolate the reflex klystron 17 from the reactive components of the power reflected from the band reject filter 19. These reflected components are doubly attenuated by the attenuator 21 since they pass through the attenuator 21 a first time before reflection and a second time before being incident upon the tube. A 3–5 db attenuation provided by attenuator 21 was sufficient to substantially decouple the klystron 17 of the above example from the detuning effects of the band reject filter 19.

Referring now to FIGS. 7–9 there is shown a preferred embodiment of the present invention wherein the flat attenuator 21 and band reject filter 19 have been incorporated in substantially the same length of X-band waveguide as used for the attenuator 21 alone. More specifically, a length of X-band guide 23 is filled with a solid dielectric material 25 as of tetrafluoroethylene resin. A rectangular resistive card 22 made of a resistive material as of 400 ohms per square is disposed on the center line of the guide 23 with the plane of the card 22 parallel to the narrow side walls of the guide. The card 22 extends across the height of the guide and is fixedly carried within a longitudinal slot in the solid dielectric material 25. A pair of resonant posts 24 and 24′ formed by, for example, a pair of gold plated 2–56 machine screws are screwed into the interior of the guide 23 from the top broad wall and on opposite sides of the resistive card 22. The dielectric material 25 is drilled in registry with the posts or screws 24 and 24′ to accommodate translation of the posts 24 and 24′. The pair of posts 24 and 24′ are disposed in approximately the same transverse plane of the guide 23 near the end of the card 22 remote from the klystron 17.

One of the screws 24′ is preferably disposed closer to the center line of the guide than the other post 24 in order to facilitate adjustment of Q and frequency for the band reject filter 19. In a preferred embodiment the two posts 24 and 24′ are disposed in the same transverse plane of the guide and since they are removed from the center line of the guide they are predominantly magnetically coupled together operating like coupled resonant circuits.

As an alternative, screws 24 and 24′ may be of different diameters and equally offset from the center line of the waveguide 23. Different diameter screws 24 and 24′ allow enhanced adjustment of the Q of the band reject response. As in the previous case different diameter screws 24 and 24″ may be offset differently from the center line of the guide to enhance ease of adjustment of the Q of the band reject response.

Typical dimensions for a composite attenuator 21 and band reject filter 19 as shown in FIGS. 7–9 are as follows: overall waveguide length of 0.625″, height of the guide 23 of 0.343″, a width of the guide 23 of 0.595″, a thickness of the resistive card 22 of 0.028″, a length of the card 22 of 0.4″, the transverse offset from the guide center line for the posts 24′ and 24 of 0.150″ and 0.218″ respectively, and the transverse center line plane of the posts 24 being 0.365″ from the end of the guide 23 abutting the output terminal 18 of the klystron 17.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A microwave oscillator circuit including, an electronically tunable oscillator having a power output response characteristic that peaks up at a certain frequency intermediate the edges of an electronically tunable bandwidth of said oscillator, an output terminal for extracting microwave energy from said oscillator, a band reject filter, a microwave transmission means interconnecting said output terminal and said band reject filter, said band reject filter having its reject band characterized by a peaked reject response and said reject peak response being tuned to approximately the certain frequency of the peaked output response frequency of said oscillator for leveling off the tunable power output response of said oscillator as passed by said band reject filter, and an attenuator connected in circuit intermediate said oscillator and said band reject filter for isolating said oscillator from the effects of wave reflections from said band reject filter, whereby the electronically tunable bandwidth of said oscillator as passed by said filter is increased between half power points.

2. The apparatus according to claim 1 wherein said oscillator is a reflex klystron.

3. The apparatus according to claim 2 including, a mixer connected in circuit to the output of said band reject filter for supplying local oscillator power to said mixer.

4. The apparatus according to claim 3 including, a variable attenuator connected intermediate said mixer and said band reject filter for controlling the local oscillator power level applied to said mixer.

5. The apparatus according to claim 2 wherein said attenuator disposed between said band reject filter and said oscillator provides at least 3 db attenuation across the electronically tunable band of said oscillator.

6. The apparatus according to claim 5 wherein said attenuator, providing at least 3 db attenuation, includes a resistive card coupled to the microwave energy in said circuit between said band reject filter and said oscillator.

7. The apparatus according to claim 2 wherein said band reject filter includes, a section of waveguide, a resonant element shunting said waveguide, said shunting element tuned for a resonance corresponding to the peak output response frequency of said oscillator.

8. The apparatus according to claim 7 wherein said waveguide is of rectangular configuration having mutually opposed pairs of broad and narrow walls, and wherein said resonant element includes a post extending into said waveguide in a direction taken across said guide from one broad side wall toward the opposing broad side wall.

9. The apparatus according to claim 8 wherein said band reject filter includes a second post extending into said waveguide in a direction across said guide from one broad side wall toward the opposing broad side wall for facilitating adjustment of the shape of the band reject response of said band reject filter.

10. The apparatus according to claim 9 wherein both of said posts are offset from the center line of said waveguide, and wherein one post is further offset than the other, whereby one post has a higher Q than the other to allow enhanced adjustment of Q and frequency of the band reject response.

11. A microwave oscillator circuit including, a reflex klystron oscillator having an output terminal for extracting microwave power over an electronically tunable band of frequencies, said output microwave power being generally characterized by decreasing in amplitude with increase in frequency deviation from a certain frequency within the electronically tunable band of frequencies, a band reject filter connected in circuit with said output terminal of said oscillator, and said band reject filter having a reject characteristic which decreases in amplitude with increase in frequency deviation from a certain frequency within the electronically tunable band of frequencies of said oscillator for leveling the microwave oscillator power over the electronically tunable band of said oscillator as passed from said oscillator through said band reject filter.

12. The apparatus according to claim 11 including an attenuator disposed in circuit in between said oscillator and said band reject filter for isolating said oscillator from the reactive effects of said band reject filter.

13. The apparatus according to claim 12 wherein said attenuator provides at least 3 db attenuation over the electronically tunable band of said oscillator.

14. The apparatus according to claim 12 wherein said attenuator includes a section of rectangular waveguide having mutually opposed pairs of broad and narrow side walls, and a resistive card disposed in said waveguide centrally thereof and extending in a direction from one broad side wall toward said other broad side wall.

15. The apparatus according to claim 14 wherein said band reject filter includes a post extending into said waveguide in a direction from one broad side wall toward said other opposed broad wall at a position in said waveguide with at least a portion of said resistive card being disposed in said guide between said oscillator and said post.

16. The apparatus according to claim 15 wherein said filter includes a second post extending into said waveguide for facilitating adjustment of the Q and frequency of the response of said band reject filter.

17. The apparatus according to claim 16 wherein said resistive card is centrally disposed of said waveguide, and said posts are disposed on opposite sides of said card.

18. The apparatus according to claim 17 wherein one of said posts is disposed closer to said card than the other of said posts.

19. The apparatus according to claim 15 wherein said rectangular guide is loaded with solid dielectric material fixedly supporting said resistive card in said guide to reduce microphonics.

20. The apparatus according to claim 17 wherein said posts are of different diameters to facilitate adjustment of the Q of the band reject response.

21. The apparatus according to claim 1 wherein said attenuator is a nonreciprocal attenuator connected to more heavily attenuate wave energy reflected from said band reject filter toward said oscillator than wave energy traveling toward said band reject filter from said oscillator.

No references cited.

KATHLEEN H. CLAFFY, *Primary Examiner.*

R. S. BELL, *Assistant Examiner.*